United States Patent
Evans et al.

(10) Patent No.: US 9,633,886 B2
(45) Date of Patent: *Apr. 25, 2017

(54) HYBRID THERMAL ELECTROSTATIC CLAMP

(71) Applicant: Varian Semiconductor Equipment Associates, Inc., Gloucester, MA (US)

(72) Inventors: Morgan D. Evans, Manchester, MA (US); Jason M. Schaller, Austin, TX (US); Ala Moradian, Beverly, MA (US); D. Jeffrey Lischer, Acton, MA (US); Gregory D. Thronson, Groveland, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 130 days.

This patent is subject to a terminal disclaimer.

(21) Appl. No.: 14/688,000

(22) Filed: Apr. 16, 2015

(65) Prior Publication Data
US 2016/0307786 A1 Oct. 20, 2016

(51) Int. Cl.
*H01T 23/00* (2006.01)
*H01L 21/683* (2006.01)
(Continued)

(52) U.S. Cl.
CPC .... *H01L 21/6833* (2013.01); *H01L 21/67103* (2013.01); *H01L 21/67115* (2013.01); *H01L 21/6831* (2013.01); *H01L 21/68735* (2013.01)

(58) Field of Classification Search
CPC .................................................. H01L 21/6833
(Continued)

(56) References Cited

U.S. PATENT DOCUMENTS 4,356,384 A 10/1982 Gat
5,262,870 A 11/1993 Nakamura et al.
(Continued)

FOREIGN PATENT DOCUMENTS

CN 103177996 A 6/2013
JP 2002-175772 A 6/2002
(Continued)

OTHER PUBLICATIONS

International Search Report and Written Opinion mailed Jul. 14, 2016 in corresponding PCT application No. PCT/US2016/025998.
(Continued)

*Primary Examiner* — Stephen W Jackson
(74) *Attorney, Agent, or Firm* — Nields, Lemack & Frame, LLC

(57) ABSTRACT

An electrostatic clamp having improved temperature uniformity is disclosed. The electrostatic clamp includes an LED array mounted along an annular ring so as to illuminate the outer edge of the workpiece. The LEDs in the LED array may emit light at a wavelength readily absorbed by the workpiece, such as between 0.4 μm and 1.0 μm. The center portion of the workpiece is heated using conductive heating provided by the heated electrostatic clamp. The outer portion of the workpiece is heated by light energy from the LED array. The LED array may be disposed on the base of the electrostatic clamp, or may be disposed on a separate ring. The diameter of the upper dielectric layer of the electrostatic clamp may be modified to accommodate the LED array.

19 Claims, 6 Drawing Sheets

(51) Int. Cl.
*H01L 21/67* (2006.01)
*H01L 21/687* (2006.01)

(58) Field of Classification Search
USPC .......................................................... 361/234
See application file for complete search history.

(56) References Cited

U.S. PATENT DOCUMENTS

| | | |
|---|---|---|
| 7,427,145 B2 | 9/2008 | Jang et al. |
| 8,404,499 B2 | 3/2013 | Moffatt |
| 9,287,148 B1 * | 3/2016 | Evans ................. H01L 21/6776 |
| 2002/0000521 A1 | 1/2002 | Brown |
| 2002/0066411 A1 | 6/2002 | Chiang et al. |
| 2003/0160255 A1 | 8/2003 | Taninaka et al. |
| 2006/0051077 A1 | 3/2006 | Kubo |
| 2008/0226272 A1 | 9/2008 | Kasai et al. |
| 2008/0268553 A1 | 10/2008 | Chan et al. |
| 2012/0127376 A1 | 5/2012 | Shikina |
| 2013/0052834 A1 | 2/2013 | Kielwein et al. |
| 2013/0126509 A1 | 5/2013 | He et al. |
| 2014/0061180 A1 | 3/2014 | Petry et al. |
| 2014/0263271 A1 | 9/2014 | Sheelavant et al. |
| 2015/0064887 A1 | 3/2015 | Manabe et al. |
| 2015/0289318 A1 | 10/2015 | Wang |

FOREIGN PATENT DOCUMENTS

| | | |
|---|---|---|
| JP | 2006-13211 A | 1/2006 |
| WO | 2014/190675 A1 | 12/2014 |

OTHER PUBLICATIONS

Morgan Evans, Dynamic Heating Method and System for Wafer Processing, U.S. Appl. No. 14/575,591, filed Dec. 18, 2014.

International Search Report and Written Opinion mailed Jul. 29, 2016 in co-pending PCT application No. PCT/US2016/029316.

Lee et al., "The Grand Challenges of Plasma Etching: A Manufacturing Perspective," Journal of Physics D: Applied Physics, vol. 47, pp. 1-9, 2014.

Shen et al., "Etch Planarization—A New Approach to Correct Non-Uniformity Post Chemical Mechanical Polishing," Advanced Semiconductor Manufacturing Conference, May 2014, pp. 423-427, IEEE.

Office action mailed Oct. 26, 2016 in co-pending U.S. Appl. No. 14/707,025.

* cited by examiner

HYBRID THERMAL ELECTROSTATIC CLAMP

FIELD

Embodiments of the present disclosure relate to a hybrid thermal electrostatic clamp, and more particularly, to an electrostatic clamp for improving the temperature uniformity of a heated workpiece.

BACKGROUND

The fabrication of a semiconductor device involves a plurality of discrete and complex processes. To perform these processes, a workpiece is typically disposed on a platen. The platen may be an electrostatic clamp or ESC, designed to retain the workpiece through the application of electrostatic forces produced by electrodes within the platen.

These electrostatic clamps are typically designed to be slightly smaller in diameter than the workpieces that they support. This insures that the electrostatic clamp is not exposed to the incoming ion beam. Contact with the ion beam could cause the generation of contaminants, or may do damage to the electrostatic clamp.

In addition to retaining the workpiece in place, the electrostatic clamp may also serve to heat the workpiece. Specifically, the electrostatic clamp is typically a larger mass of material, capable of supplying heat to the workpiece in other embodiments. In certain embodiments, the electrostatic clamp has conduits on its upper surface which supply a back side gas to the space between the upper surface of the ESC and the back surface of the workpiece. The electrostatic clamp may also have an outer seal ring near the outer edge, which serves to confine the back side gas in this volume and minimize back side gas leakage. The outer seal ring extends upward from the upper surface of the ESC and contacts the workpiece, forming a wall that contains the back side gas. This outer seal ring is effective because it contacts the workpiece. However, this outer seal ring is not disposed at the outer edge of the workpiece. Furthermore, it some embodiments, it is desirable to tilt the workpiece relative to the ion beam. This may be accomplished by tilting the electrostatic clamp, which may cause the ESC to become exposed to the ion beam. To minimize this exposure, the electrostatic clamp may be constructed to be smaller than the workpiece that is disposed thereon.

Because the electrostatic clamp is somewhat smaller than the workpiece, the outer edge of the workpiece may not be heated as effectively by the electrostatic clamp. Thus, in embodiments where the electrostatic clamp supplies heat to the workpiece, the outer edge of the workpiece may be cooler than the rest of the workpiece.

This difference in temperature may impact the yield of the workpiece. Therefore, it would be beneficial if there were an electrostatic clamp capable of achieving better temperature uniformity across a workpiece, in embodiments where the workpiece is heated by the ESC.

SUMMARY

An electrostatic clamp having improved temperature uniformity is disclosed. The electrostatic clamp includes an LED array mounted along an annular ring so as to illuminate the outer edge of the workpiece. The LEDs in the LED array may emit light at a wavelength readily absorbed by the workpiece, such as between 0.4 µm and 1.0 µm. The center portion of the workpiece is heated using conductive heating provided by the heated electrostatic clamp. The outer portion of the workpiece is heated by light energy from the LED array. The LED array may be disposed on the base of the electrostatic clamp, or may be disposed on a separate ring. The diameter of the upper dielectric layer of the electrostatic clamp may be modified to accommodate the LED array.

According to one embodiment, an electrostatic clamp is disclosed. The electrostatic clamp comprises a base having a top surface with a first diameter; an upper dielectric layer having a bottom surface with a second diameter, wherein the bottom surface of the upper dielectric layer is disposed on the top surface of the base and the second diameter is less than the first diameter, so as to create a horizontal annular ring on the top surface of the base; and a LED array disposed on the horizontal annular ring.

According to another embodiment, an electrostatic clamp is disclosed. The electrostatic clamp comprises an upper dielectric layer having a top surface and a bottom surface; a base having a recess shaped to accommodate the upper dielectric layer, wherein the base has a recessed top surface in contact with the bottom surface of the upper dielectric layer, and an annular top surface that surrounds the upper dielectric layer and is disposed at a height less than the top surface of the upper dielectric layer; and a LED array disposed on the annular top surface of the base.

According to another embodiment, an electrostatic clamp is disclosed. The electrostatic clamp comprises a base; an upper dielectric layer disposed on the base; a circular ring disposed around an outer edge of the upper dielectric layer; and an LED array disposed on a top surface of the circular ring. In certain embodiments, the width of the circular ring is less than the overhang of the workpiece, allowing the circular ring to be protected from beam strike.

BRIEF DESCRIPTION OF THE FIGURES

For a better understanding of the present disclosure, reference is made to the accompanying drawings, which are incorporated herein by reference and in which.

DETAILED DESCRIPTION

As described above, the edges of workpieces disposed on traditional electrostatic clamps may overhang the ESC, causing these edges to maintain a different temperature than the rest of the workpiece.

Figure 1:
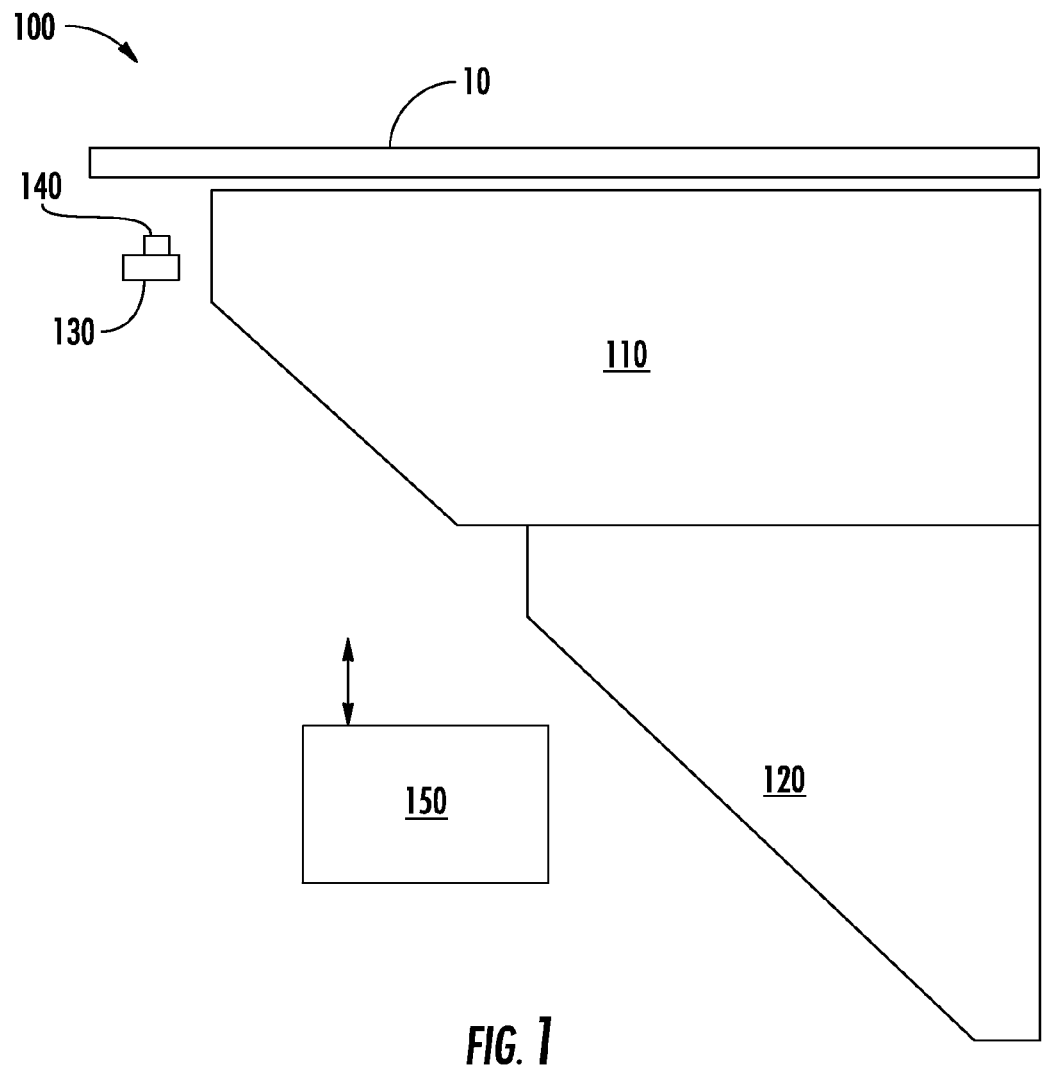
FIG. 1 is a view of an electrostatic clamp according to one embodiment.

FIG. 1 shows a first embodiment of an electrostatic clamp 100. In this embodiment, the electrostatic clamp 100 comprises an upper dielectric layer 110, which is communication with the back surface of the workpiece 10. A plurality of electrodes may be disposed within the upper dielectric layer 110. Alternating voltage waveforms are applied to these electrodes, which create an electrostatic force that holds the workpiece 10 in place. This upper dielectric layer 110 may be unable to withstand ion beam strike.

In some embodiments, the electrostatic clamp 100 comprises a plurality of conduits terminating on the top surface of the upper dielectric layer 110 of the electrostatic clamp 100, which deliver back side gas to the volume between the top surface of the upper dielectric layer 110 and the bottom surface of the workpiece 10. The electrostatic clamp 100 may also have an outer seal ring (not shown) near the outer edge, which serves to confine the back side gas in this volume and minimize back side gas leakage. The outer seal ring extends upward from the top surface of the upper dielectric layer 110 and contacts the workpiece 10, forming a wall that contains the back side gas. This outer seal ring is effective because it contacts the workpiece 10. Thus, because of the outer seal ring and the susceptibility of the upper dielectric layer 110, the electrostatic clamp 100 is typically smaller than the workpiece 10 which is disposed thereon, to insure that the ion beam cannot strike the ESC. In some embodiments, the workpiece 10 may overhang the electrostatic clamp 100 by 2-3 mm, although other dimensions are also possible and within the scope of the disclosure.

Disposed beneath the upper dielectric layer 110 may be a base 120. This base may be metal, such as aluminum, or may be another thermally conductive material.

As described above, the upper dielectric layer 110 may not extend to the outer edge of the workpiece 10. In certain embodiments, the workpiece 10 may overhang approximately 2-3 millimeters. In this embodiment, a circular ring 130 may be disposed along the edge of the upper dielectric layer 110. The circular ring 130 may be a clamp, which is tightened against the upper dielectric layer 110. In other embodiments, the circular ring 130 may be affixed to the upper dielectric layer 110, such as by adhesive. In other embodiments, the circular ring 130 may be supported by a mounting frame, which attaches to the base 120. In each of these embodiments, the circular ring 130 is disposed along the circumference of the upper dielectric layer 110. The circular ring 130 may be disposed about 1 to 10 mm below the bottom surface of the workpiece 10. The circular ring 130 may have a width of about 2-3 mm, as it fits in the width between the outer edge of the electrostatic clamp 100 and the outer edge of the workpiece 10. In other words, the diameter of the workpiece 10 is greater than the diameter of the upper dielectric layer 110, so as to create an overhang, and the width of the circular ring 130 is less than the overhang. In this way, the workpiece 10 protects the circular ring 130 from beam strike.

An LED array 140 may be disposed on the top surface of the circular ring 130. In certain embodiments, the LED array 140 comprises LEDs arranged in rows and columns. The number of LEDs disposed in the radial direction may be referred to as the number of rows of LEDs in the LED array 140. The number of LEDs disposed in the circumferential direction may be referred to the number of columns. In some embodiments, the LED array 140 comprises a single LED is disposed in the radial direction. In other embodiments, two or more LEDs may be disposed in the radial direction.

The LEDs are spaced apart around the entirety of the circular ring 130. In certain embodiments, 256 LEDs are disposed around the circular ring 130. For a circular ring 130 having a diameter of about 300 mm, this implies a spacing of about 3.7 mm between adjacent LEDs in the circumferential direction. Of course, more or fewer LEDs may be used. For example, 64 or 128 LEDs may also be employed and the number of LEDs is not limited by this disclosure. In certain embodiments, a greater number of LEDs may create a more uniform temperature profile along the circumference of the workpiece 10.

In certain embodiments, the LED array 140 comprises a plurality of high power LEDs, which emit light of a wavelength or a plurality of wavelengths that is readily absorbed by the substrates, are used. For example, silicon exhibits high absorptivity and low transmissivity in the range of wavelengths between about 0.4 and 1.0 μm. Silicon absorbs more than 50% of the energy emitted in the range of wavelengths from 0.4 to 1.0 μm. LEDs that emit light in this range of wavelengths may be used. In certain embodiments, LEDs made from GaN are employed. These GaN LEDs emit light at a wavelength of about 450 nm.

In certain embodiments, the circular ring 130 is disposed such that the workpiece 10 extends radially past the upper dielectric layer 110 to a greater extent than the circular ring 130. In this way, the circular ring 130 may be protected from ion beam strike by the workpiece 10.

A controller 150 may be in communication with the LED array 140 to control the illumination and turning off of the LEDs in the LED array 140. In some embodiments, the LEDs are actuated as a single entity, such that all of the LEDs in the LED array 140 are either on or off. In this embodiment, the amount of power applied to each LED may be the same. In other embodiments, the LEDs may be divided into zones, where each zone is independently controlled. In this embodiment, the amount of power applied to each zone may be independently controlled.

In certain embodiments, the controller 150 uses open loop control to control the LED array 140. In other words, the controller 150 may be provided with a target temperature of the workpiece 10, such as 400° C. or 500° C. Based on the target temperature, the controller 150 determines the amount of power to supply to the LED array 140. In another embodiment, the controller 150 may use closed loop control. In this embodiment, a temperature sensor (not shown) may be disposed near the outer edge of the workpiece 10, so that the actual temperature of the workpiece 10 at this region may be measured. The controller 150 then determines the amount of power to apply to the LED array 140 based on the target temperature and the actual temperature of the workpiece 10.

Figure 2:
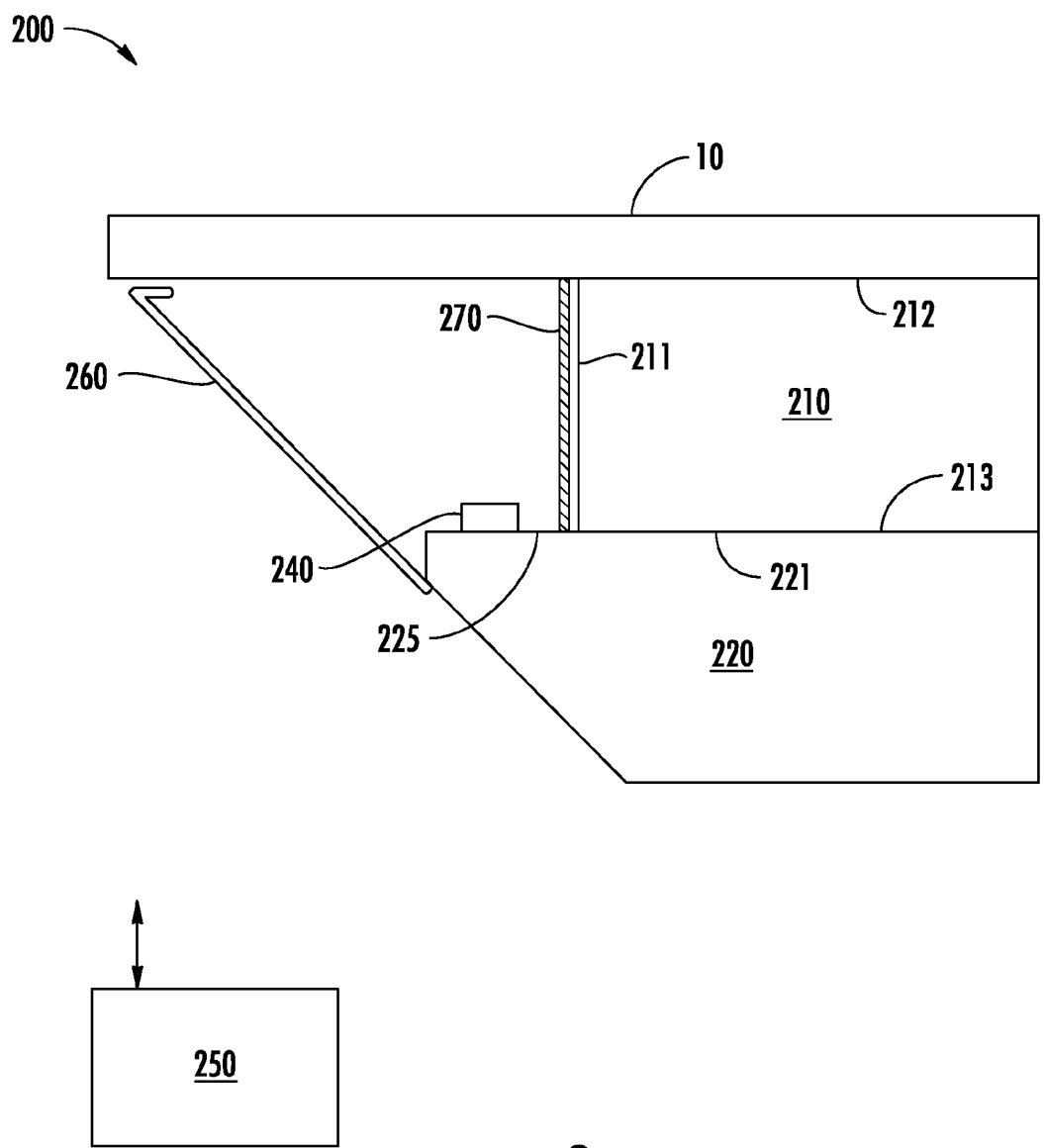
FIG. 2 is a view of an electrostatic clamp according to a second embodiment.

FIG. 2 shows a second embodiment of an electrostatic clamp 200. Like FIG. 1, the electrostatic clamp 200 comprises an upper dielectric layer 210 and a base 220. The upper dielectric layer 210 may be constructed and function as described above with respect to the upper dielectric layer 110. Similarly, the base 220 may be constructed and function as described above with respect to base 120.

In this embodiment, the upper dielectric layer 210 has been modified to reduce its radius, such that the base 220 may extend radially outward further than the upper dielectric layer 210. The upper dielectric layer 210 may have vertical sidewalls 211, such that the diameter of the top surface 212 of the upper dielectric layer 210 is the same as the diameter of the bottom surface 213 of the upper dielectric layer 210. The base 220 has a top surface 221 which has a larger diameter than the bottom surface 213 of the upper dielectric layer 201. This arrangement creates a horizontal annular ring portion 225, which is a horizontal portion of the base 220 that is not covered by the upper dielectric layer 210. Stated differently, the horizontal annular ring portion 225 of the base 220 is separated from the workpiece 10 by only an air gap. The difference between the radius of the top surface 221 of the base 220 and the bottom surface 213 of the upper dielectric layer 210 defines the width of the horizontal annular ring portion 225. Additionally, the radius of the top surface 221 of the base 220 defines the outer radius of the horizontal annular ring portion 225. The radius of the bottom surface 213 of the upper dielectric layer 210 defines the inner radius of the horizontal annular ring portion 225. In some embodiments, the diameter of the top surface 221 of the base 220 may be between 200 and 300 mm, while the diameter of the bottom surface 213 of the upper dielectric layer 210 may be between 5 and 50 mm less than the diameter of the top surface 221 of the base 220.

An LED array 240 is disposed on this horizontal annular ring portion 225 of the base 220. Like the LED array of FIG. 1, the LEDs may emit light at a wavelength readily absorbed by the workpiece 10. In certain embodiments, GaN LEDs are employed, which emit light at a wavelength of 450 nm.

The LEDs which make up the LED array 240 may be varied in size, and the dimensions of the LED are not limited by the disclosure. The dimensions of the horizontal annular ring portion 225 and the size of the LEDs in the LED array 240 may define the maximum number of LEDs that may be disposed on the horizontal annular ring portion 225. However, the actual number of LEDs disposed in the horizontal annular ring portion 225 is not limited by the disclosure.

In certain embodiments, the LED array 240 comprises a single row of LEDs. In other embodiments, two or more rows of LEDs may be disposed in the radial direction. The LEDs are spaced apart around the entirety of the horizontal annular ring portion 225. As described above, any number of LEDs may be disposed in the circumferential direction, such as 64, 128 or 256 LEDs.

In the embodiment shown in FIG. 2, the workpiece 10 extends further in the radial direction than the horizontal annular ring portion 225. Therefore, to effectively heat the outer edge of the workpiece 10, the LEDs of the LED array 240 may be angled outward in the radial direction, such as at an angle of 45° or 60°. In embodiments where more than one row of LEDs are used, each row of LEDs may be disposed at a different angle. For example, the outermost row may be disposed at a 60° angle in the radial direction, while the adjacent row may be disposed at a smaller angle, such as 45° or 30°. The innermost row of LEDs may be disposed at the smallest angle.

An edge shield 260 may be disposed at the horizontal annular ring portion 225 and extend to, without touching, the workpiece 10. This edge shield 260 may be affixed to the base 220 and may form an outer surface of the electrostatic clamp 200. This edge shield 260 may serve two purposes. First, the edge shield 260 may protect the upper dielectric layer 210 and the LED array 240 from ion beam strike. Thus, even when a tilted implant is performed, the upper dielectric layer 210 and the LED array 240 are protected. Secondly, the edge shield 260 may also serve to reflect light from the LED array 240 toward the bottom surface of the workpiece 10. For example, some of the light emitted by the LED array 240 may be reflected off an interior surface. The inner surface of the edge shield 260 may reflect this light toward the bottom surface of the workpiece 10, improving the energy transfer to the workpiece 10.

As described above, a controller 250 may be in communication with the LED array 240 to control the illumination, applied power and actuating of the LEDs in the LED array 240. In some embodiments, the LEDs are actuated as a single entity, such that all of the LEDs in the LED array 240 are actuated at the same power level. In other embodiments, the LEDs may be divided into zones, where each zone is independently controlled. For example, in embodiments where more than one row of LEDs are employed, the power applied to each row may be independently controlled.

In certain embodiments, the controller 250 uses open loop control to control the LED array 240. In other words, the controller may be provided with a target temperature of the workpiece 10, such as 400° C. or 500° C. Based on the target temperature, the controller determines the amount of power to supply to the LED array 240. In another embodiment, the controller 250 may use closed loop control. In this embodiment, a temperature sensor (not shown) may be disposed near the outer edge of the workpiece 10, so that the actual temperature of the workpiece 10 at this region may be measured. The controller 250 then determines the amount of power to apply to the LED array 240 based on the current power level, the target temperature and the actual temperature of the workpiece 10.

In some embodiments, an interior shield 270 is used to protect the upper dielectric layer 210 from the light emitted by the LED array 240.

Figure 3:
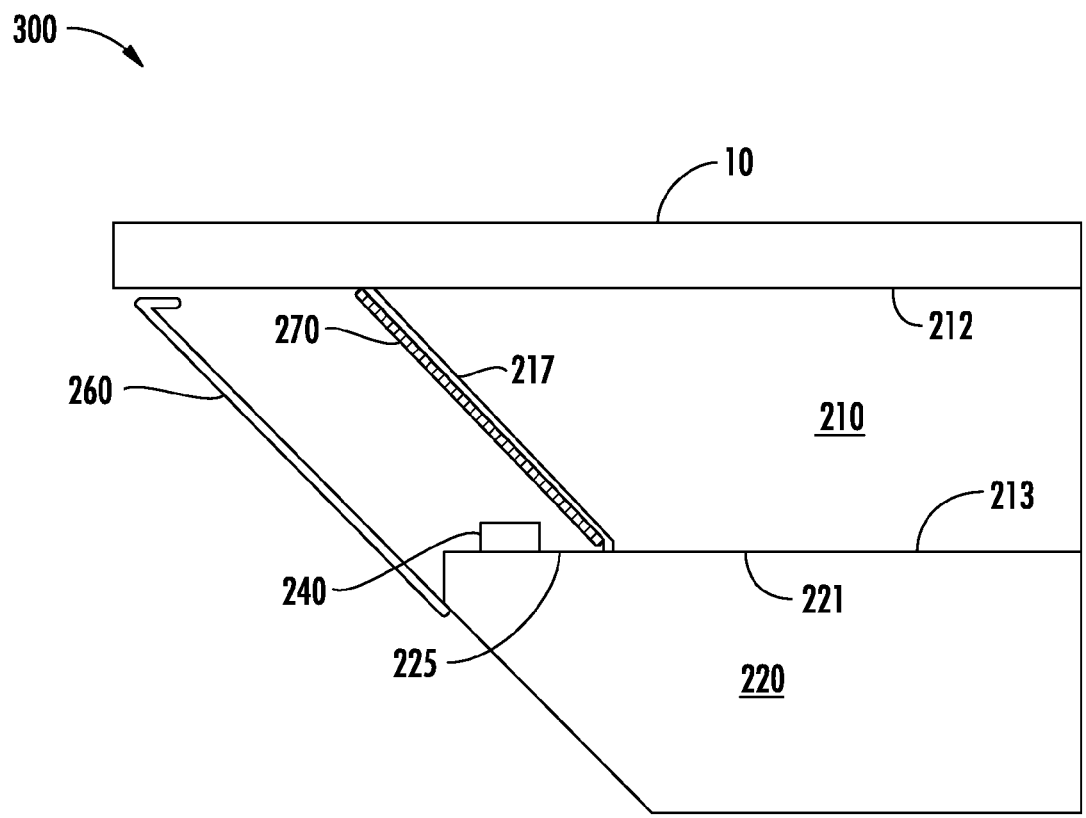
FIG. 3 is a view of an electrostatic clamp according to a third embodiment.
Figure 3:
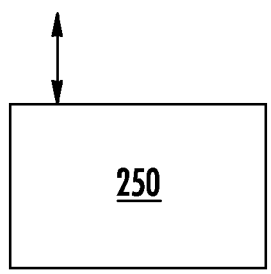

FIG. 3 shows a variation of the electrostatic clamp 300. In this figure, components having like functions have been given identical reference designators. In the embodiment shown in FIG. 2, the upper dielectric layer 210 has a vertical sidewall 211, extending between the workpiece 10 and the base 220. In the electrostatic clamp 300 of FIG. 3, the upper dielectric layer 210 has a sloped sidewall 217 where the diameter of the top surface 212 of the upper dielectric layer 210 is greater than the bottom surface 213 of the upper dielectric layer 210, near the base 220. The sloped sidewall 217 may form any suitable angle relative to the top surface 221 of the base 220. In certain embodiments, the sloped sidewall 217 may form a 60° angle relative to the top surface 221 of the base 220.

The diameter of the bottom surface 213 of the upper dielectric layer 210 near the base 220 is less than the diameter of the top surface 221 of the base 220 at this point, allowing the creation of the horizontal annular ring portion 225. For example, as described above, the bottom surface 213 of the upper dielectric layer may have a diameter than is between 5 and 50 mm less than the diameter of the top surface 221 of the base 220. As in FIG. 2, the LED array 240 may be disposed on the horizontal annular ring portion 225. An edge shield 260, an interior shield 270 and a controller 250 may also be used in this embodiment. These components function as described with respect to FIG. 2.

By using a sloped sidewall 217, the top surface 212 of the upper dielectric layer 210 is in communication with more of the workpiece 10 than was the case in FIG. 2. This may reduce the amount of heating that is provided by the LED array 240.

In both of these embodiments, the bottom surface 213 of the upper dielectric layer 210 is planar and is in contact with the top surface 221 of the base 220, which is also planar. The diameter of the bottom surface 213 of the upper dielectric layer 210 is less that the diameter of the top surface 221 of the base 220. This allows a horizontal annular ring portion 225 to exist on the top surface 221 of the base, on which the LED array 240 may be disposed. The LED array 240 may have one or more rows in the radial direction and extend around the circumference of the horizontal annular ring portion 225. The sidewalls of the upper dielectric layer may be vertical, as shown in FIG. 2, or may be sloped, as shown in FIG. 3. In both of these embodiments, an edge shield 260 may be disposed to protect the LED array 240 and the upper dielectric layer 210 from ion beam strike. Additionally, an interior shield 270 may be used to protect the upper dielectric layer 210 from the light and heat emitted from the LED array 240. The LEDs in the LED array 240 may be angled outwardly in the radial direction. The number of LEDs in the LED array 240 is not limited by either embodiment. A controller 250 may be used to control the illumination of the LEDs in the LED array 240 to regulate the temperature of the outer edge of the workpiece 10. The controller 250 may use open loop control or closed loop control.

Figure 4:
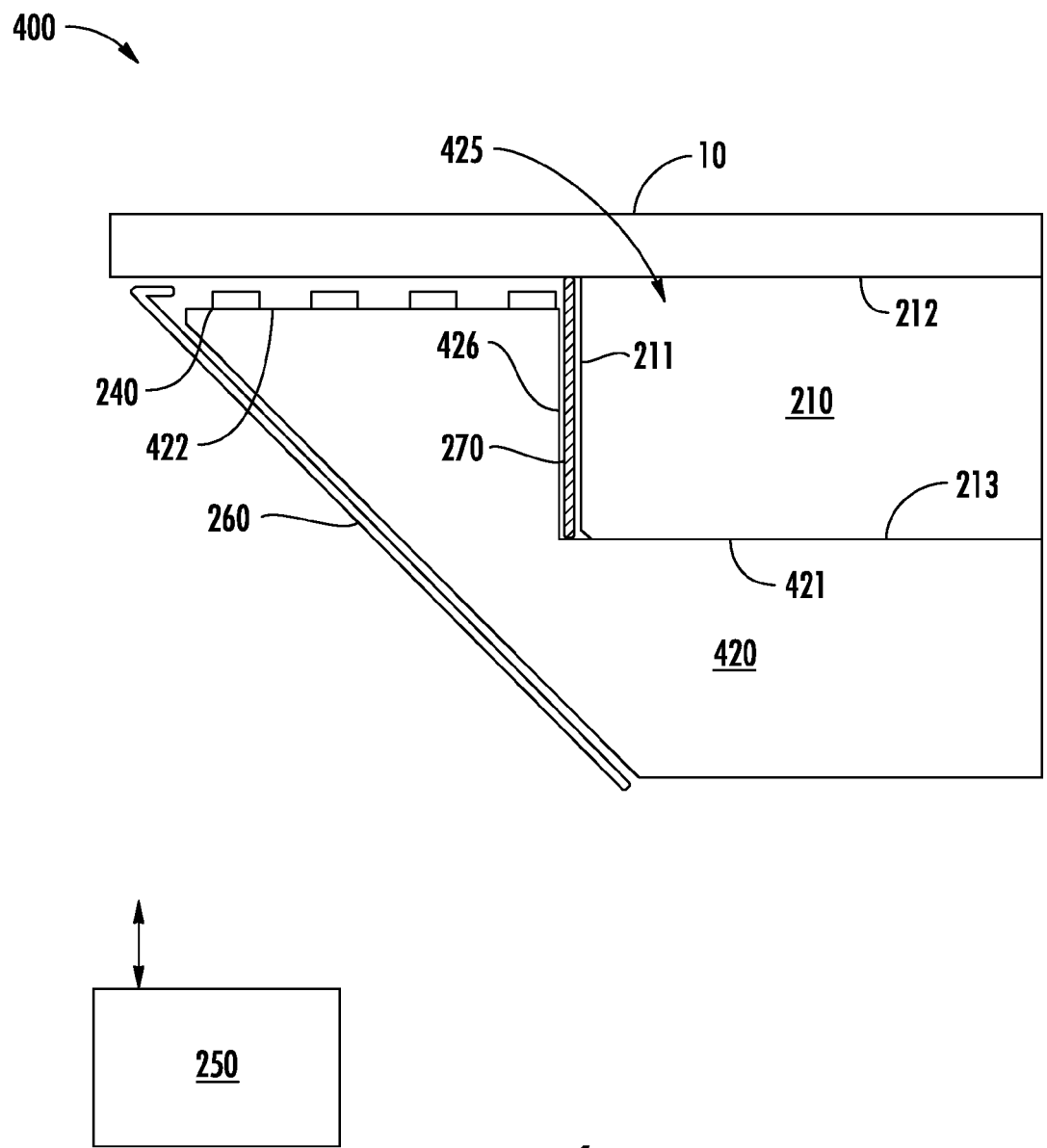
FIG. 4 is a view of an electrostatic clamp according to a fourth embodiment.

FIG. 4 shows another embodiment of the electrostatic clamp 400. Like FIG. 3, this embodiment 400 uses many of the same components as FIG. 2, and accordingly the same reference designators will be assigned to like components.

In this embodiment, the upper dielectric layer 210 may be as described in FIG. 2 and have vertical sidewalls 211. In this embodiment, the base 420 may have a recess 425 in which the upper dielectric layer 210 is disposed. In this embodiment, the sidewalls 426 of the recess 425 may also be vertical. The diameter of the recess 425 may be slightly larger than the diameter of the upper dielectric layer 210, so that the upper dielectric layer 210 easily fits within the recess 425. In certain embodiments, an interior shield 270 is disposed between the sidewall 426 of the recess 425 and the vertical sidewalls 211 of the upper dielectric layer 210. In certain embodiments, the upper dielectric layer 210 may have a diameter that is between 6 and 100 mm smaller than the diameter of the workpiece 10.

The base 420 may have a recessed top surface 421, which is in contact with the bottom surface 213 of the upper dielectric layer 210, and an annular top surface 422, which surrounds the upper dielectric layer 210. The annular top surface 422 is an annular ring that surrounds the upper dielectric layer 210. The annular ring may have a width of between 3 and 50 mm. The annular top surface 422 may be at a height that is less than the height of the top surface 212 of the upper dielectric layer 210. In other words, while the top surface 212 of the upper dielectric layer 210 may be in communication with the bottom surface of the workpiece 10, the annular top surface 422 is disposed at a lower height so that a gap exists between the annular top surface 422 and the bottom surface of the workpiece 10. This gap may be between 1 and 10 mm in certain embodiments.

The LED array 240 may be disposed on the annular top surface 422 of the base 420 that surrounds the upper dielectric layer 210. This LED array 240 may be controlled using a controller 250, as described above. While FIG. 4 shows four rows of LEDs in the LED array 240, the disclosure is not limited to any particular number of rows. As described above, the number of LEDs in the circumferential direction is also not limited and may be, for example, 64, 128 or 256.

In certain embodiments, such as that shown in FIG. 4, the outer walls of the base 420 may be sloped. This may allow a tilted implant to be performed without the ion beam striking the base 420. In other embodiments, the outer walls of the base 420 may be vertical. In certain embodiments, an edge shield 260 is disposed proximate the outer wall of the base 420. In certain embodiments, the edge shield 260 may be affixed to the outer wall of the base 420.

Further, while the annular top surface 422 is shown as being horizontal, the disclosure is not limited to this embodiment. For example, the annular top surface 422 may be angled outwardly in the radial direction so that the LEDs in the LED array 240 are angled toward the outer edge of the workpiece 10. In other embodiments, the annular top surface 422 may be horizontal and the LEDs in the LED array 240 may be angled toward the outer edge of the workpiece 10.

Figure 5:
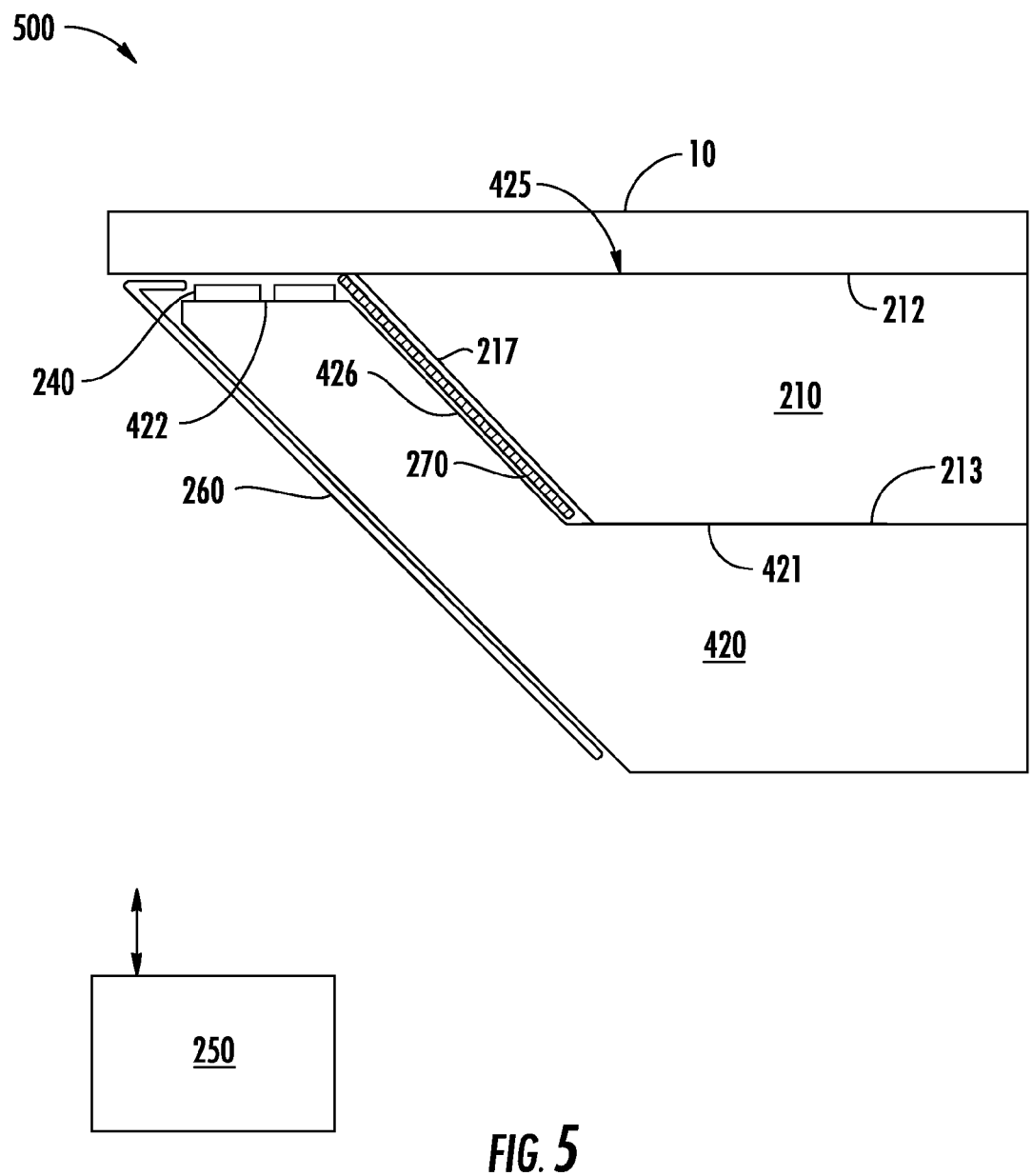
FIG. 5 is a view of an electrostatic clamp according to a fifth embodiment.

FIG. 5 shows another embodiment of an electrostatic clamp 500. In this embodiment, the upper dielectric layer 210 has sloped sidewalls 217, similar to those described with respect to FIG. 3. In other words, the diameter of the top surface 212 of the upper dielectric layer 210 is greater than the diameter of the bottom surface 213 of the upper dielectric layer 210. In certain embodiments, the sloped sidewalls 217 may form an angle of 60° with the recessed top surface 421 of the base 420. In this embodiment, the recess 425 in the base 420 is shaped so as to accommodate the sloped sidewalls 217 of the upper dielectric layer 210. In other words, the sidewalls 426 of the recess 425 are also sloped to accommodate the upper dielectric layer 210. The base 420 has a recessed top surface 421 on which the upper dielectric layer 210 is disposed. The base 420 also has an annular top surface 422 that surrounds the upper dielectric later 210. The annular top surface 422 may have a width of between 3 and 50 mm. The annular top surface 422 may be at a height that is less than the height of the top surface 212 of the upper dielectric layer 210. In other words, while the top surface 212 of the upper dielectric layer 210 may be in communication with the bottom surface of the workpiece 10, the annular top surface 422 is disposed at a lower height so that a gap exists between the annular top surface 422 and the bottom surface of the workpiece 10. The gap between the annular top surface 422 and the bottom surface of the workpiece may be between 1 and 10 mm.

As described above, the annular top surface 422 may be horizontal in certain embodiments or may be angled in other embodiments. Additionally, the LEDs in the LED array 240 may be angled toward the outer edge of the workpiece 10.

Because the diameter of the top surface 212 of the upper dielectric layer 210 is greater than the top surface 212 of the electrostatic clamp 400 in FIG. 4, the upper dielectric layer 210 of FIG. 5 may heat a greater portion of the workpiece 10. Consequently, the LED array 240 in FIG. 5 may heat a smaller portion of the workpiece 10. While FIG. 5 shows two rows of LEDs in the LED array 240, any number of rows may be employed. Additionally, the number of LEDs in the circumferential direction is not limited by the disclosure.

Figure 6:
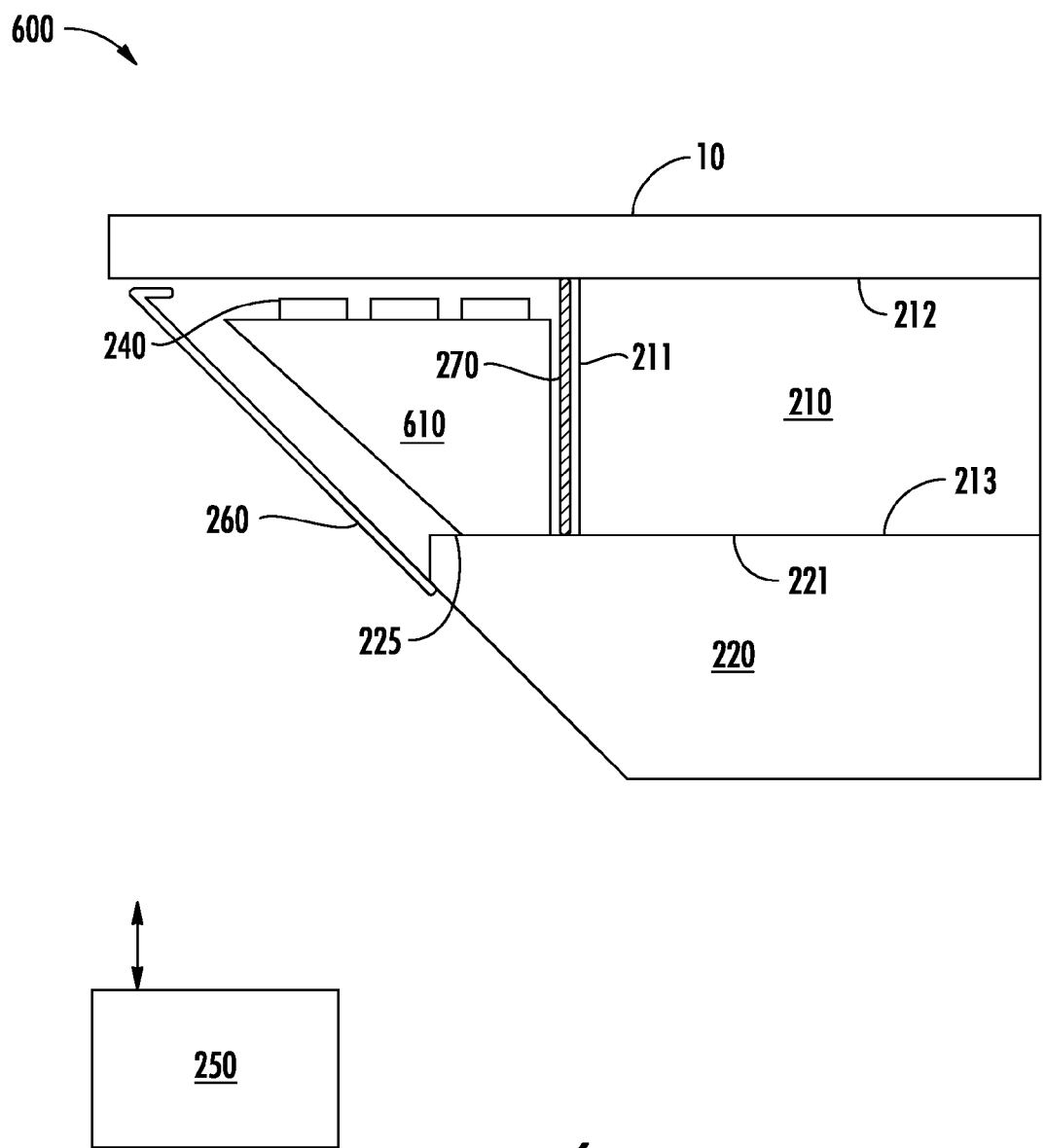
FIG. 6 is a view of an electrostatic clamp according to a sixth embodiment.

While FIG. 4 and FIG. 5 show the base 420 as an integral component, other embodiments are also possible. For example, the annular top surface 422 may be part of a separate component. For example, returning to FIG. 2, a separate element may be disposed on the horizontal annular ring portion 225 of the base 220. The LED array 240 may be disposed on the top surface of this component. This configuration is shown in the electrostatic clamp 600 of FIG. 6. In this embodiment, a separate element 610 is disposed on the horizontal annular ring portion 225 of the base 220. The LED array 240 is disposed on the top surface of this element 610. In other words, the element 610 may be used to lift the LED array 240 closer to the bottom surface of the workpiece 10. An edge shield 260 may be attached to the base 220 and used to protect the element 610, the LED array 240 and the upper dielectric layer 210.

In each of the embodiments described herein, the workpiece is heated using two different mechanisms. Most of the workpiece is heated through conduction, where a volume of gas is disposed between the bottom surface of the workpiece and the top surface of a heated electrostatic clamp. As described above, the outer seal ring provides a barrier which contains the back side gas between the workpiece and the electrostatic clamp. This back side gas provides a heating mechanism between the electrostatic clamp and the workpiece, as the back side gas is heated by the ESC and transfers that heat to the workpiece. In other words, the ESC provides conductive heating through the use of back side gas. Thus, the portion of the workpiece that extends beyond the outer seal ring is not effectively heated by the ESC and the back side gas. Additionally, the ESC also serves to hold the workpiece in place through electrostatic forces created by applying voltages to the electrodes disposed within the ESC.

In contrast, the outer edge of the workpiece is heated by light energy, where the light is emitted at a particular range of wavelengths and directed toward the outer edge of the workpiece. The use of these two mechanisms allows a more uniform temperature profile of the workpiece.

The embodiments described above in the present application may have many advantages. For example, in one test, it was determined that, without the use of an LED array, the temperature at the edge of a workpiece drops at least 21° C. from the center temperature, which is maintained at 500° C. A LED array having a single row of 256 LEDs maintained the temperature at the outer edge to within 1° C. of the center temperature. This LED array consumed only 55 W of power. To maintain temperature uniformity of less than 1° C. for a 400° C. center temperature, the LED array consumed only about 17 W of power. In other words, the use of LEDs which emit light at a wavelength readily absorbed by the workpiece enhance the coupling between the light emitted and the temperature increase of the workpiece, thus minimizing the amount of power needed to maintain temperature uniformity.

Additionally, the present disclosure relies on light to heat the workpiece. Because of this, it is possible to dispose the LED array in a plurality of different positions. In other words, the LED array does not need to be disposed extremely close to the surface of the workpiece, as long as there is a line-of-sight path between the LED array and the workpiece. Further, the LEDs may be angled to direct the light at a specific portion of the workpiece. This allows the LED array to be disposed away from the edge of the workpiece and still be capable of heating the outer edge. By disposing the LED array away from the outer edge of the workpiece, tilted implants may be performed without potentially damaging the LED array or any other components.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An electrostatic clamp, comprising:
   a base having a top surface with a first diameter;
   an upper dielectric layer having a bottom surface with a second diameter, wherein the bottom surface of the upper dielectric layer is disposed on the top surface of the base and the second diameter is less than the first diameter, so as to create a horizontal annular ring on the top surface of the base; and
   a LED array disposed on the horizontal annular ring.

2. The electrostatic clamp of claim 1, wherein the upper dielectric layer has a top surface having a third diameter, wherein the third diameter is greater than the second diameter.

3. The electrostatic clamp of claim 1, wherein the upper dielectric layer has a top surface having a third diameter, wherein the third diameter is equal to the second diameter.

4. The electrostatic clamp of claim 1, wherein the LED array comprises a plurality of LEDs which emit light at a wavelength readily absorbed by a workpiece clamped to the upper dielectric layer.

5. The electrostatic clamp of claim 4, wherein the plurality of LEDs emit light at a wavelength between 0.4 and 1.0 μm.

6. The electrostatic clamp of claim 1, further comprising a controller in communication with the LED array so as to regulate a temperature of an outer edge of a workpiece clamped to the upper dielectric layer.

7. The electrostatic clamp of claim 1, further comprising an edge shield affixed to the base and forming an outer surface of the electrostatic clamp, wherein the edge shield protects the upper dielectric layer and the LED array from ion beam strike.

8. The electrostatic clamp of claim 1, wherein LEDs in the LED array are angled toward an outer edge of a workpiece clamped to the upper dielectric layer.

9. An electrostatic clamp, comprising:
   an upper dielectric layer having a top surface and a bottom surface;
   a base having a recess shaped to accommodate the upper dielectric layer, wherein the base has a recessed top surface in contact with the bottom surface of the upper dielectric layer, and an annular top surface that surrounds the upper dielectric layer and is disposed at a height less than the top surface of the upper dielectric layer; and
   a LED array disposed on the annular top surface of the base.

10. The electrostatic clamp of claim 9, wherein the top surface of the upper dielectric layer has a first diameter, and the bottom surface of the upper dielectric layer has a second diameter, and the first diameter is greater than the second diameter.

11. The electrostatic clamp of claim 9, wherein the top surface of the upper dielectric layer has a first diameter, and the bottom surface of the upper dielectric layer has a second diameter, and the first diameter is equal to the second diameter.

12. The electrostatic clamp of claim 9, wherein the LED array comprises a plurality of LEDs, which emit light at a wavelength between 0.4 and 1.0 μm.

13. The electrostatic clamp of claim 9, further comprising a controller in communication with the LED array so as to regulate a temperature of an outer edge of a workpiece.

14. An electrostatic clamp, comprising:
    a base;
    an upper dielectric layer disposed on the base;
    a circular ring disposed around an outer edge of the upper dielectric layer; and
    an LED array disposed on a top surface of the circular ring.

15. The electrostatic clamp of claim 14, wherein the LED array comprises a plurality of LEDs, which emit light at a wavelength between 0.4 μm and 1.0 μm.

16. The electrostatic clamp of claim 14, wherein the circular ring to affixed to the outer edge of the upper dielectric layer.

17. The electrostatic clamp of claim 14, wherein the circular ring is supported by a mounting frame attached to the base.

18. The electrostatic clamp of claim 14, wherein the upper dielectric layer is configured to support a workpiece, and a diameter of the workpiece is greater than a diameter of the upper dielectric layer so as to create an overhang, and a width of the circular ring is less than the overhang.

19. The electrostatic clamp of claim 18, wherein the circular ring is disposed between 1 and 10 mm below a bottom surface of the workpiece.

* * * * *